United States Patent [19]

Nagayama

[11] Patent Number: 5,369,061
[45] Date of Patent: Nov. 29, 1994

[54] METHOD OF PRODUCING SEMICONDUCTOR DEVICE USING A HYDROGEN-ENRICHED LAYER

[75] Inventor: Tetsuji Nagayama, Kanagawa, Japan

[73] Assignee: Sony Corporation, Tokyo, Japan

[21] Appl. No.: 77,054

[22] Filed: Jun. 16, 1993

[30] Foreign Application Priority Data

Jun. 16, 1992 [JP] Japan .................................. 4-156981

[51] Int. Cl.$^5$ ..................... H01L 21/302; H01L 21/31
[52] U.S. Cl. ...................................... 437/228; 437/24; 437/978; 156/653; 156/659.1; 156/644
[58] Field of Search ................ 437/228, 24, 978, 644; 156/643, 646, 653, 657, 659.1

[56] References Cited

U.S. PATENT DOCUMENTS

| | | | |
|---|---|---|---|
| 4,705,596 | 11/1987 | Gimpelson et al. | 156/643 |
| 4,705,597 | 11/1987 | Gimpelson et al. | 156/643 |
| 5,034,091 | 7/1991 | Trask et al. | 156/643 |

FOREIGN PATENT DOCUMENTS 2-62038  3/1990  Japan .

*Primary Examiner*—T. N. Quach

*Attorney, Agent, or Firm*—Hill, Steadman & Simpson

[57] ABSTRACT

A method of producing a semiconductor device whereby it is possible to carry out anisotropic dry etching of a contact hole without generating dimensional losses even though a resist pattern has an inversely tapered cross-sectional shape. If the resist pattern is formed by using a chemical amplification negative resist material which is expected to be applied to excimer laser lithography, the resist pattern tends to have an inversely tapered cross-sectional shape due to resolution mechanism thereof. Thus, a hydrogen-enriched layer is formed in advance on a surface of a silicon oxide interlayer insulation film, and hydrogen released during etching is utilized for promoting deposition of carbonaceous polymer which is an etching reaction product. The carbonaceous polymer is deposited on a sidewall surface of the resist pattern and corrects an apparent cross-sectional shape into a vertical wall state. Therefore, diffusion of incident ion on an edge portion of the resist pattern can be prevented. The hydrogen-enriched layer can be formed, either by depositing silicon oxide, silicon nitride, amorphous silicon and the like in a CVD method, or by ion implantation of hydrogen into the silicon oxide interlayer insulation film.

13 Claims, 4 Drawing Sheets $(A_2 = B_2)$ $\begin{pmatrix} A_3 = B_3, \\ A_3 > A_2, \\ B_3 > B_2 \end{pmatrix}$

METHOD OF PRODUCING SEMICONDUCTOR DEVICE USING A HYDROGEN-ENRICHED LAYER

BACKGROUND OF THE INVENTION

The present invention relates to a method of producing a semiconductor device, and particularly to a method for solving a problem of dimensional losses in case of performing hole processing using as a mask a resist pattern with its cross-sectional shape inversely tapered.

As design rules of semiconductor devices have become minute as seen in VLSI and ULSI, studies have been made on high numerical aperture of an exposure device, short wavelength of exposure and improvement of photoresist materials in the field of photolithography. Particularly, excimer laser lithography using an excimer laser light source such as a KrF excimer laser light (248 nm) instead of a conventional g line (436 nm) or i line (365 nm) of high pressure mercury lamp as an exposure light source is noted as an art whereby high resolution may be attained relatively easily.

Meanwhile, in excimer laser lithography, it is difficult to apply a novolac based positive photoresist, which has been typically used for the g-line exposure and i-line exposure. A novolac resin has a base resin and an aromatic ring of naphthoquinone diazide based compound added as a photosensitizer have large absorption in a wavelength range of the KrF excimer laser light. Thus, the novolac based positive photoresist lacks sensitivity. In addition, transmittance of the exposure light is drastically reduced, and the cross-sectional shape of the photoresist pattern is tapered.

Also, in a stepper using the excimer laser as the light source, the laser light of a narrow range of wavelengths is used for the purpose of eliminating chromatic aberration due to wavelength distribution. Thus, in order to cover the shortage of exposure, a material of high sensitivity is demanded as a resist material.

In view of the above-described status of the art, a photoresist material whereby high sensitivity and high resolution can be attained at the excimer laser wavelength is demanded. As such a photoresist, so-called chemical amplification resist has been noted recently. The chemical amplification resist is a photoresist of a type for generating acid by photoreaction from a photoreactive acid generator such as onium salt or a polyhalogen compound, referred to hereinafter simply as a photo-acid generator, and then advancing the resist reaction such as polymerization, crosslinking and conversion of functional groups by thermal processing or post-baking in the presence of the acid, thereby generating changes in melting speed.

Chemical amplification resists are categorized into negative and positive types in accordance with the type of resist reaction, and into two-component system, three-component system and the like in accordance with the number of basic components. Under the status quo, a negative three-component resist which uses novolac resin for the base resin, DDT or p,p'-dichlorodiphenyltrichloroethane for the photo-acid generator, and hexamethylolmelamine for the acid crosslinking agent is regarded as most practical. The resolution mechanism of this resist is based on the fact that acid is generated from DDT by exposure of the KrF excimer laser, and then promotes crosslinking of the base resin due to the crosslinking agent at the time of post-baking, thereby rendering an exposure portion insoluble in an alkali.

However, the chemical amplification resist has a problem that a large gradient is generated if material design to raise absorptance is carried out in order to reduce standing-wave effects. That is, in the positive resist, acid diffusion becomes great in the vicinity of the surface of the resist layer, promoting a light decomposition reaction, so that the cross-sectional shape of the resist pattern after development is tapered. On the contrary, in the negative resist, the crosslinking reaction is promoted in the vicinity of the surface of the resist layer, so that the cross-sectional shape after development is inversely tapered. If hole processing for opening a contact hole or a via-hole, for instance, is carried out using as a mask the resist pattern with the cross-sectional shape deteriorated in the above-mentioned manner, the following problems are generated. The problems are described referring to FIGS. 1a, 1b and FIGS. 2a, 2b. Partly common numerals are used in these figures.

First, a case is considered in which a surface of an interlayer insulation film 12 stacked on an underlying metallization 11 having a step is flattened with a positive photoresist film, and is patterned to form a resist pattern 13 having its cross-sectional shape tapered, as shown in FIG. 1a. The resist pattern 13 has a first aperture 14 in an upper region of the step and a second aperture 15 in a lower region of the step. However, since the apertures 14, 15 having the same tilt are formed in regions which are different in thickness of the photoresist film, a diameter $A_1$ of the first aperture 14 on the bottom is larger than a diameter $B_1$ of the second aperture 15 on the bottom. As etching of the interlayer insulation film 12 in a later process is carried out in a normal ion mode, it is the bottom that prescribes an incidence range of ion. Accordingly, if etching is carried out using the resist pattern 13 as a mask, diameters of contact holes 16, 17 which are formed, will substantially reflect the diameters $A_1$, $B_1$ on the bottom of the apertures 14, 15, respectively. In short, even though the contact holes 16, 17 have the same dimensional design above and below the step, different diameters are obtained actually.

Meanwhile, if the surface of the interlayer insulation film 12 is flattened with the negative photoresist film, the cross-sectional shape of the resist pattern 18 after the phenomenon is inversely tapered, as shown in FIG. 2a. At this time, a first aperture 19 and a second aperture 20 are formed in an upper region and a lower region of the step, respectively. However, diameters $A_2$, $B_2$ on the uppermost surfaces of the apertures 19, 20 which prescribe an incidence range of ion in etching of interlayer insulation film 12 in a later process are equal. Accordingly, if the interlayer insulation film 12 is etched in the ion mode, diameters $A_3$, $B_3$ of contact holes 21, 22 formed to correspond to the apertures 19, 20 becomes equal to each other.

Thus, the problem of the difference in the diameters of the contact holes above and below the step is tentatively solved by masking with the negative resist pattern. In the process under the status quo, etching conditions for securing high selectivity to the resist pattern are employed.

However, these apertures are not necessarily formed as designed by the dimensional design or anisotropically. In the example shown in FIG. 2b for instance, the diameters $A_3$, $B_3$ of the contact holes 21, 22 are larger than the diameters $A_2$, $B_2$ of the apertures 19, 20. It is considered that such dimensional losses are generated by the enlargement of the diameters due to an attack against sidewalls of the etching pattern by a slant incidence component created by the diffusion of the incident ions at an edge portion of the resist pattern 18. Such a resist pattern which is inversely tapered is positively utilized for taper-etching of a contact hole, as described in the Extended Abstract of the 49th Autumn Meeting of the Japan Society of Applied Physics, Lecture No. 7p-K-14, p. 567. Thus, it is essentially difficult to apply the inversely tapered resist pattern to anisotropic processing.

OBJECT AND SUMMARY OF THE INVENTION

It is an object of the present invention to provide a method whereby, even when the cross-sectional shape of a resist pattern is inversely tapered, a silicon compound layer under the resist pattern may be etched without generating dimensional losses.

The present inventor considered it necessary to shape the cross-sectional shape so that sidewalls of the resist pattern are perpendicular to the underlying silicon compound layer, for fundamentally solving the problems such as generation of dimensional losses and deterioration of anisotropic shape. Thus, the present inventor noted effects of hydrogen on the deposition of the carbonaceous polymer.

Generally, it is known that in an etching process of the silicon compound layer, a carbonaceous decomposition product is formed by sputtering of the resist pattern by incident ions or a carbonaceous polymer is formed by polymerizing a decomposition product of fluorocarbon contained in an etching gas. Further, it is also known that deposition of the carbonaceous polymer is promoted by the presence of hydrogen in the etching gas. For instance, it is reported, in the Proceedings of the Second Symposium on Dry Process (1980), p.49-53, that if the amount $H_2$ added to a gas system in etching silicon nitride by using a $CF_4$ gas, the cross-sectional shape of an etching pattern is loosened by an increase in deposits.

In the present invention, hydrogen which contributes to promotion of polymer deposition is supplied, not from the gas system, but from the silicon compound layer which is a material layer to be etched. In short, if a hydrogen-enriched layer is formed at least in a portion in a direction of thickness of the silicon compound layer, hydrogen is released in an etching reaction system during the etching of the hydrogen-enriched layer. Then, the released hydrogen is taken into a carbonaceous decomposition product supplied by forward sputtering of the resist pattern or dissociation of the etching gas due to electric discharges, thereby forming the polymer with a high deposition property. The polymer starts to be deposited on a narrow portion where ion incidence is most difficult to take place on the sidewalls of the resist pattern and where vapor pressure of the etching reaction product becomes low, and ultimately shapes the resist pattern so that the apparent sidewall surface becomes substantially perpendicular to the silicon compound layer. Accordingly, diffusion incident ion on the edge portion of the resist pattern becomes difficult to take place, thereby preventing generation of dimensional losses and deterioration of anisotropic shape.

Practically, the hydrogen-enriched layer can be formed by growing in a gaseous phase at least one of silicon oxide, silicon nitride and amorphous silicon. It is known that hydrogen contents of the materials mentioned above are varied by controlling film forming conditions in the CVD method. For example, the above-mentioned change in hydrogen content of silicon oxide is described in S.M. Sze ed., VLSI Technology, McGraw-Hill, 1988, p.258. The description about silicon nitride is in ibid,. p.262. The description about amorphous silicon is in the Chemical Engineering Association ed., CVD Handbook, Asakura Shoten, 1991, p.310.

It is also possible to change a portion from the surface to a predetermined depth of the silicon compound layer into the hydrogen-enriched layer by ion implantation of hydrogen into the silicon compound layer.

In any case, the presence of such a hydrogen-enriched layer will not greatly change the original etching characteristics of the silicon compound layer. In addition, the deposited etching reaction product can be removed simultaneously with ashing of the resist pattern.

Further, if a negative photoresist material is used, the resist pattern having the inversely tapered cross-sectional shape can be naturally formed in accordance with original photosensitive characteristics of this material, even without performing particular physical processings.

Thus, the present invention is effective particularly in a process to which a chemical amplification negative photoresist suitable for excimer laser lithography and its exposure wavelength is applied, for carrying out minute processing of submicron level and quarter micron level from now on.

BRIEF DESCRIPTION OF THE DRAWINGS

FIG. 1a shows a state in which a tapered positive resist pattern is formed on an interlayer insulation film having a step. FIG. 1b shows a state in which diameters of contact holes above and below the step differ.

FIG. 2a shows a state in which an inversely tapered negative resist pattern is formed on an insulation film having a step. FIG. 2b shows a state in which a dimensional loss is generated between diameter of a resist pattern and diameter of the contact hole.

FIG. 3a shows a process of forming an interlayer insulation film. FIG. 3b shows a process of forming an $SiO_X$:H layer or an $SiN_X$:H layer or an a-Si:H layer as a hydrogen-enriched layer. FIG. 3c shows a process of forming an inversely tapered resist pattern. FIG. 3d shows a process of etching the hydrogen-enriched layer or the interlayer insulation film while shaping the resist pattern with a polymer layer. FIG. 3e shows a process of ashing removal of the resist pattern and the polymer layer.

FIG. 4a shows a process of implanting hydrogen ion into an interlayer insulation film. FIG. 4b shows a process of forming an inversely tapered resist pattern. FIG. 4c shows a process of etching the ion-implanted layer and the interlayer insulation film while shaping the resist pattern with a polymer layer. FIG. 4d shows a process of ashing removal of the resist pattern and the polymer layer.

DETAILED DESCRIPTION OF THE INVENTION

Figure 1A:
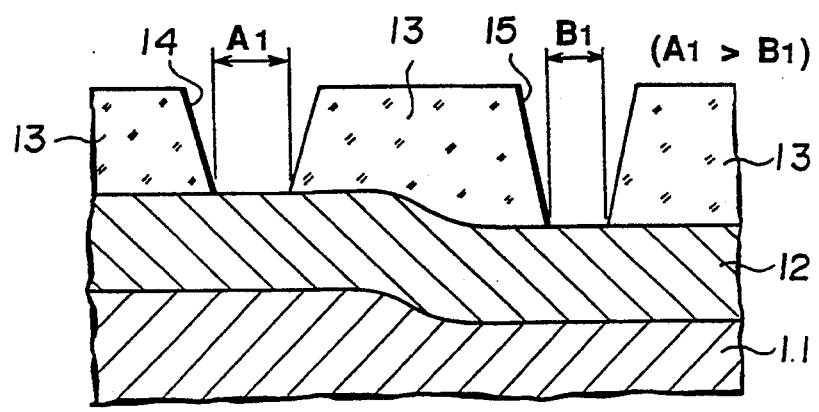
FIGS. 1a and 1b are schematic cross-sectional views for explaining problems in an example of a conventional process.
Figure 1B:
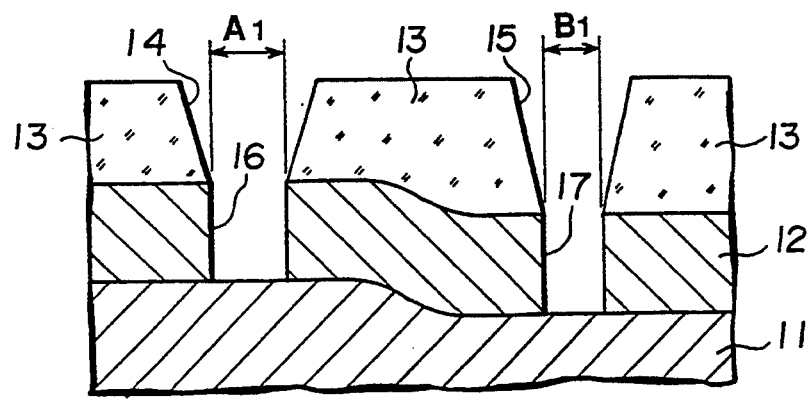
Figure 2A:
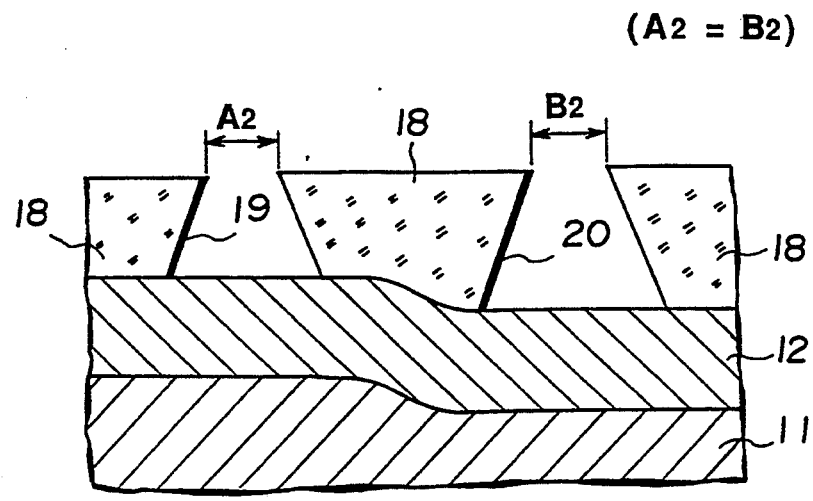
FIGS. 2a and 2b are schematic cross-sectional views for explaining problems in an the example of the conventional process.
Figure 2B:
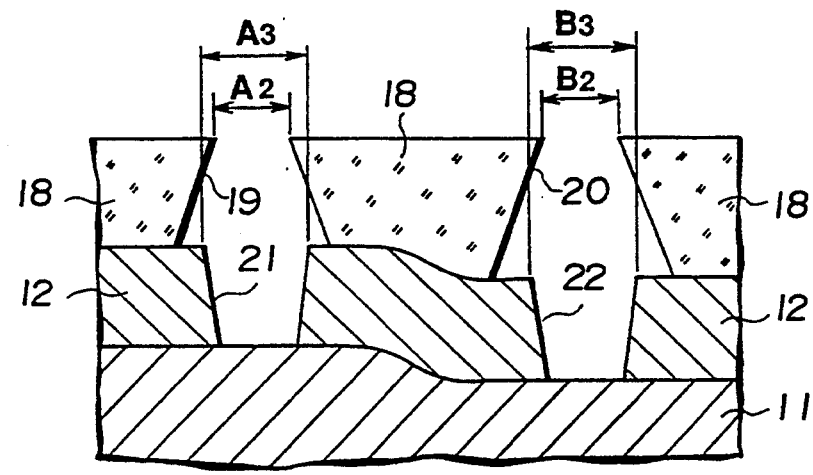

Hereinafter, preferred embodiments of the present invention are explained referring to the drawings.

EXAMPLE 1

In the present example, an $SiO_2$ interlayer insulation film having a hydrogen-enriched $SiO_X$ layer, hereinafter referred to as $SiO_X$:H layer, formed on a surface layer portion thereof was etched via an inversely tapered resist pattern comprised of a chemical amplification negative photoresist material. This process is explained, referring to FIGS. 3a to 3e.

Figure 3A:
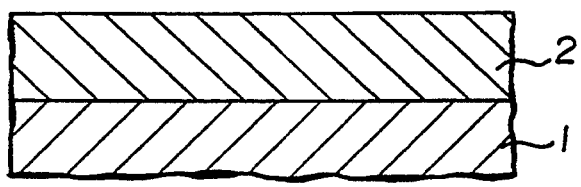
FIGS. 3a to 3e are schematic cross-sectional views for explaining a series of processes to which the present invention is applied, in order of the processes.

First, an $SiO_2$ interlayer insulation film 2 was formed on an underlying metallization 1 formed on a wafer, as shown in FIG. 3a. The underlying metallization 1 may be any one of a single crystal silicon substrate having impurity diffused regions formed therein, a polysilicon layer, a polycide film, an Al based metallization layer, a silicide layer and a refractory metal. The $SiO_2$ interlayer insulation film 2 was formed with a thickness of about 0.8 μm by carrying out plasma CVD, for example, under the following conditions:

| $SiH_4$ flow rate | 300 SCCM |
| --- | --- |
| $O_2$ flow rate | 300 SCCM |
| gas pressure | 333 Pa (= 2.5 Torr) |
| film forming time | 4 min. |
| wafer temperature | 400° C. |

Figure 3B:
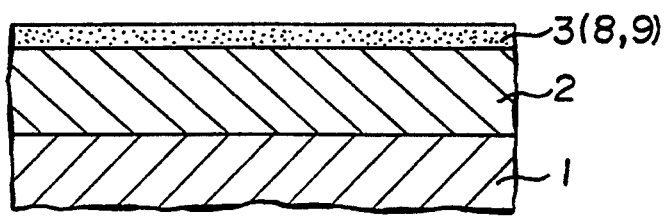

Next, an $SiO_X$:H layer 3 with a thickness of about 0.2 μm was formed on the $SiO_2$ interlayer insulation film 2, as shown in FIG. 3b. An example of film forming conditions is shown below.

| $SiH_4$ flow rate | 400 SCCM |
| --- | --- |
| $O_2$ flow rate | 300 SCCM |
| gas pressure | 333 Pa (= 2.5 Torr) |
| film forming time | 1 min. |
| wafer temperature | 350° C. |

In this process, a higher $SiH_4$ flow rate than in film formation of the $SiO_2$ interlayer insulation film 2 was employed, and the wafer temperature was lowered, thereby increasing the hydrogen content in the silicon oxide. The hydrogen content of the $SiO_X$:H layer 3 was about 10%.

Figure 3C:
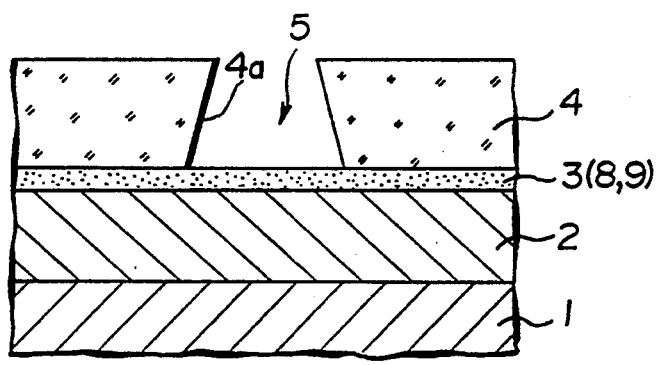

Next, a chemical amplification negative photoresist (Shipley Co., Ltd. made: trade name SAL601) was applied so as to form a photoresist layer with a thickness of 1 μm, and selective exposure was carried out by using a KrF excimer laser stepper. Then, after post-baking and alkali development processing, a resist pattern 4 as shown in FIG. 3c was formed. The resist pattern 4 had the cross-sectional shape inversely tapered, and a sidewall surface 4a inclined in an overhung state to an aperture 5. The diameter at the entrance of the aperture 5 is about 0.35 μm.

Then, the wafer in this state was set on a magnetically-enhanced microwave plasma etcher, and the $SiO_X$:H layer 3 and the $SiO_2$ interlayer insulation film 2 were etched, for instance, under the following conditions:

| $c-C_4F_9$ flow rate | 15 SCCM |
| --- | --- |
| $CH_2F_2$ flow rate | 10 SCCM |
| gas pressure | 0.27 Pa (= 2 Torr) |
| microwave power | 1200 W (2.45 GHz) |
| RF bias power | 300 W (800 kHz) |
| wafer temperature | −50° C. (with an ethanol based coolant) |

$c-C_4F_8$ (octafluorocyclobutane) promotes high-speed etching by a large amount of F* and CF* formed from one molecule, while it contributes to the formation of the carbonaceous polymer having a high deposition property by the fragments taking in the H, which is released during the etching of the $SiO_X$:H layer 3. Also, $CH_2F_2$ is originally a gas for easily depositing carbonaceous polymer. Further, carbonaceous fragments are supplied also by incident ion sputtering the resist pattern 4, and are to be materials for the carbonaceous polymer.

With these contributions, a polymer layer 6 was formed on the sidewall surface 4a, and the apparent sidewall surface of the resist pattern is shaped substantially vertically. Such shaping is possible for the following reasons. That is, a mean free path of ions is extended under low gas pressure, and orientations of ions are aligned. Therefore, though polymer is deposited on a narrow portion where ion incidence is difficult such as the bottom of the sidewall surface 4a, the polymer layer 6 grown to some extent is sputtered by incident ions, and will not deposit in such a way as to protrude into the aperture 5.

Figure 3D:
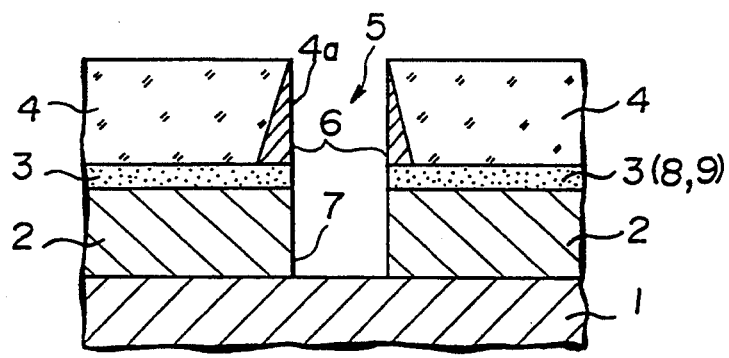

By such etching, a contact hole 7 having the same diameter as the diameter at the entrance of the resist pattern 4 and having a vertical wall was formed, as shown in FIG. 3d.

Finally, the wafer was transferred to an ashing device, where normal $O_2$ plasma ashing was carried out. The resist pattern 4 and the polymer layer 6 were removed without generating any residue, as shown in FIG. 3e.

Figure 3E:
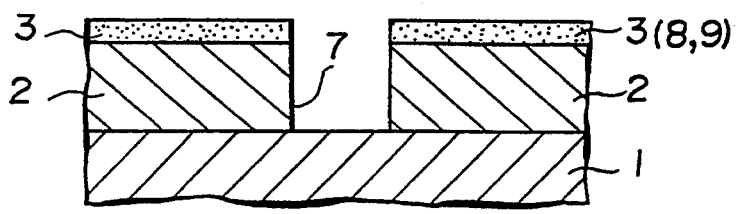

As is clear from FIG. 3e, since in this process the $SiO_X$:H layer 3 remains on the surface of the $SiO_2$ interlayer insulation film 2 so as to utilize the two layers 2, 3 as an insulation film in the device, it is preferable to form the $SiO_2$ interlayer insulation film 2 to be thinner by the thickness of the $SiO_X$:H layer 3.

EXAMPLE 2

In the present example, an $SiO_2$ interlayer insulation film having a hydrogen-enriched $SiN_X$ layer, hereinafter referred to as $SiN_X$:H layer, formed on a surface portion thereof was etched via an inversely tapered resist pattern comprised of a chemical amplification negative photoresist material. The process is explained, referring to FIGS. 3a to 3e again.

First, an $SiO_2$ interlayer insulation film was deposited on an underlying metallization 1, as shown in FIG. 3a, under the same conditions as in example 1.

Next, CVD was carried out, for instance, under the following conditions, and an $SiN_X$:H layer 8 as shown in FIG. 3b was formed with a thickness of about 0.2 μm.

| $SiN_4$ flow rate | 200 SCCM |
| --- | --- |
| $NH_3$ flow rate | 2000 SCCM |
| $N_2$ flow rate | 1000 SCCM |
| gas pressure | 333 Pa (= 2.5 Torr) |
| film forming time | 1 min. |

-continued

| wafer temperature | 350° C. |
|---|---|

The hydrogen content of the SiN$_X$:H layer 8 thus formed was about 30%.

Then, using a chemical amplification negative photoresist (Shipley Co., Ltd. made: trade name SAL601), an inversely tapered resist pattern 4 as shown in FIG. 3c was formed in a method similar to example 1.

Further, the SiN$_X$:H layer 8 and the SiO$_2$ interlayer insulation film 2 were etched via the resist pattern 4, for example, under the following conditions:

| c-C$_4$F$_9$ flow rate | 15 SCCM |
|---|---|
| CH$_2$F$_2$ flow rate | 10 SCCM |
| gas pressure | 0.27 Pa (= 2 mTorr) |
| microwave power | 1200 W (2.45 GHz) |
| RF bias power | 300 W (800 kHz) |
| wafer temperature | −20° C. (with an ethanol based coolant) |

In this etching process, a polymer layer 6 was formed efficiently by hydrogen released from the SiN$_X$:H layer 8 containing about 30% of hydrogen. As a result, despite the higher wafer temperature than in example 1, a contact hole 7 having a highly anisotropic shape was formed, as shown in FIG. 3d.

EXAMPLE 3

In the present example, an SiO$_2$ interlayer insulation film having an amorphous silicon layer, hereinafter referred to as a-Si:H layer, formed on a surface portion thereof was etched via an inversely tapered resist pattern comprised of a chemical amplification negative photoresist material. The process is explained, referring to FIGS. 3a to 3e again.

First, an SiO$_2$ interlayer insulation film 2 was deposited on an underlying metallization 1, as shown in FIG. 3a, under the same conditions as in example 1.

Next, CVD was carried out, for instance, under the following conditions, and an a-Si:H layer 9 as shown in FIG. 3b was formed with a thickness of about 0.2 μm.

| SiH$_4$ flow rate | 500 SCCM |
|---|---|
| He flow rate | 50 SCCM |
| gas pressure | 80 Pa (= 0.6 Torr) |
| film forming time | 30 min. |
| wafer temperature | 400° C. |

The hydrogen content of the a-Si:H layer 9 thus formed was about 20%.

Then, using a chemical amplification negative photoresist (Shipley Co., Ltd. made: trade name SAL601), an inversely tapered resist pattern 4 as shown in FIG. 3c was formed in a manner similar to example 1.

Further, the a-Si:H layer 9 and the SiO$_2$ interlayer insulation film 2 were etched via the resist pattern 4, for example, under the following conditions:

| c-C$_4$F$_8$ flow rate | 15 SCCM |
|---|---|
| CH$_2$F$_2$ flow rate | 10 SCCM |
| gas pressure | 0.27 Pa (= 2 mTorr) |
| microwave power | 1200 W (2.45 GHz) |
| RF bias power | 300 W (800 kHz) |
| wafer temperature | −30° C. (with an ethanol based coolant) |

In this etching process, a polymer layer 6 was formed efficiently by hydrogen released from the a-Si:H layer 9 containing about 20% hydrogen. As a result, a contact hole 7 having a highly anisotropic shape as shown in FIG. 3d was formed in a wafer temperature range between those of examples 1 and 2.

Meanwhile, in the present example, since the a-Si:H layer 9 which is not an insulating material remains on the surface of the SiO$_2$ interlayer insulation film 2 as shown in FIG. 3e after ashing removal of the resist pattern 4 and the polymer layer 6, the a-Si:H layer 9 may be removed by selective etching, if necessary.

EXAMPLE 4

In the present example, unlike in example 3, ion implantation of hydrogen was carried out to an SiO$_2$ interlayer insulation film, thereby rendering a surface portion of the SiO$_2$ interlayer insulation film into a hydrogen-enriched state. This process is explained, referring to FIGS. 4a to 4d. Numerals in FIGS. 4a to 4d are partly common to those in FIGS. 3a to 3e.

Figure 4A:
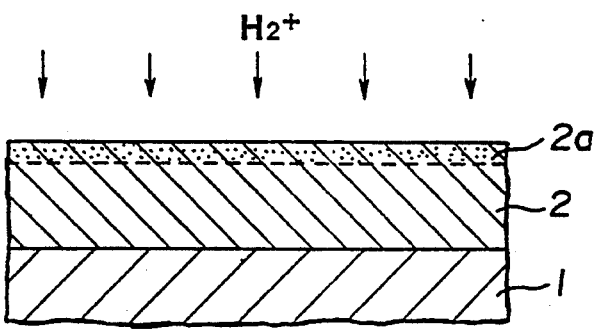
FIGS. 4a to 4d are schematic cross-sectional views for explaining another series of processes to which the present invention is applied, in order of the processes.

First, an SiO$_2$ interlayer insulation film 2 was formed on an underlying metallization 1, as shown in FIG. 4a. Conditions for film formation of the SiO$_2$ interlayer insulation film 2 are as described above in example 1 except for the film forming time of 5 minutes and the film thickness of 1 μm. Ion implantation of H$_2^+$ was carried out to the SiO$_2$ interlayer insulation film 2 under the following conditions:

| beam current | 5 mA |
|---|---|
| ion accelerating voltage | 10 kv |
| dosage | 1 × 10$^{17}$ units/cm$^2$ |

By this ion implantation, a region from the surface portion to a depth of about 0.2 μm of the SiO$_2$ interlayer insulation film 2 became a hydrogen ion implanted layer 2a.

Figure 4B:
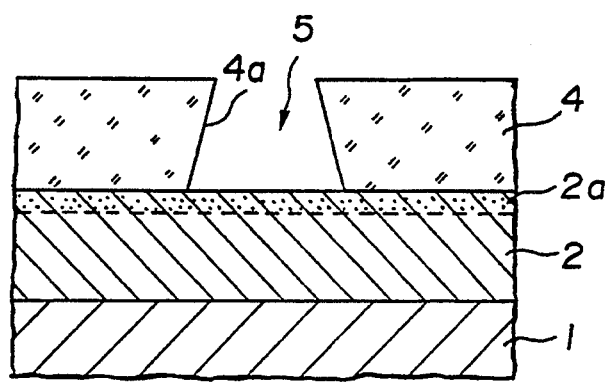

Then, an inversely tapered resist pattern 4 was formed in accordance with the same process as in example 1, as shown in FIG. 4b.

Further, the hydrogen ion implanted layer 2a and the SiO$_2$ interlayer insulation film 2 were etched via the resist pattern 4, for instance, under the following conditions:

| c-C$_4$F$_8$ flow rate | 15 SCCM |
|---|---|
| CH$_2$F$_2$ flow rate | 10 SCCM |
| gas pressure | 0.27 Pa (= 2 mTorr) |
| microwave power | 1200 W (2.45 GHz) |
| RF bias power | 300 W (800 kHz) |
| wafer temperature | −40° C. (with an ethanol based coolant) |

Figure 4C:
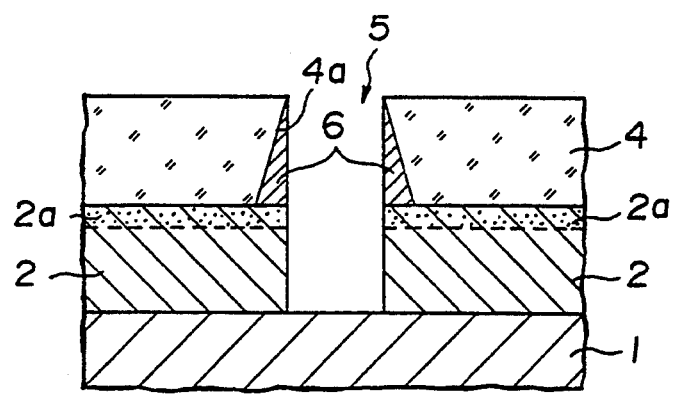

In this etching process, a polymer layer 6 was efficiently formed by hydrogen released from the hydrogen ion implanted layer 2a, thereby forming a contact hole 7 having a highly anisotropic shape as shown in FIG. 4c.

Figure 4D:
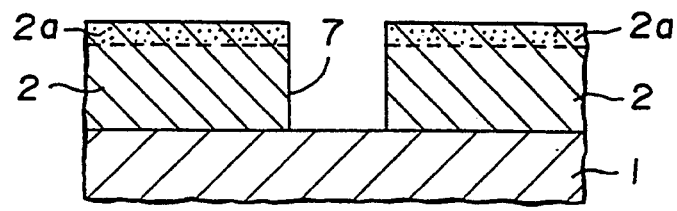

Finally, when ashing was carried out, the resist pattern 4 and the polymer layer 6 were removed without generating any residue, as shown in FIG. 4d.

The present invention has been described on the basis of the above four examples. However, it is a matter of course that the present invention is limited to these examples, and that composition, construction, film forming conditions, patterning methods and etching conditions of various material layers formed on the wafer are suitably variable.

What is claimed is:

1. A method of producing a semiconductor device comprising the steps of:

forming a first layer on a substrate, said first layer containing silicon material and having a surface opposite the substrate with a hydrogen-enriched layer at least on a portion of the surface;

forming on said surface of the first layer a resist pattern having an inversely tapered cross-sectional shape; and etching said first layer using said resist pattern as a mask;

wherein hydrogen released from said hydrogen-enriched layer during said etching is utilized for promoting deposition of an etching reaction product, and said first layer is etched while the cross-sectional shape of said resist pattern is shaped in a substantially vertical wall state by the deposition of the etching reaction product.

2. The method of producing a semiconductor device as claimed in claim 1 wherein said hydrogen-enriched layer is formed by growing in a gaseous phase at least one layer of silicon material selected from the group consisting of silicon oxide, silicon nitride and amorphous silicon.

3. The method of producing a semiconductor device as claimed in claim 1 wherein said hydrogen-enriched layer is formed by ion implantation of hydrogen into said first layer.

4. The method of producing a semiconductor device as claimed in claim 1 wherein said resist pattern is formed by using a negative photoresist material.

5. The method of producing a semiconductor device as claimed in claim 1 wherein said etching reaction product is a carbonaceous polymer.

6. A method of producing a semiconductor device comprising the steps of:

growing in a gaseous phase a layer comprised of at least one silicon material selected from the group consisting of silicon oxide, silicon nitride and amorphous silicon, as a hydrogen-enriched layer on a silicon oxide interlayer insulation film covering an underlying metallization;

forming on said hydrogen-enriched layer a resist pattern having an inversely tapered cross-sectional shape; and etching said hydrogen-enriched layer and silicon oxide interlayer insulation film using said resist pattern as a mask and an etching gas containing a fluorocarbon based compound;

wherein hydrogen released from said hydrogen-enriched layer during said etching is utilized for promoting deposition of an etching reaction product, and said silicon oxide interlayer insulation film is etched while the cross-sectional shape of said resist pattern is shaped in a substantially vertical wall state by the deposition.

7. The method of producing a semiconductor device as claimed in claim 6 wherein said resist pattern is formed by using a chemical amplification negative photoresist material.

8. The method of producing a semiconductor device as claimed in claim 6 wherein said underlying metallization is constituted by using one material selected from the group consisting of an impurity diffused region in a single crystal silicon substrate, a polysilicon layer, a polycide film, an aluminum based material layer, a silicide layer and a refractory metal layer.

9. The method of producing a semiconductor device as claimed in claim 6 wherein said etching gas contains a hydrofluorocarbon based compound.

10. A method of producing a semiconductor device comprising the steps of:

forming a hydrogen-enriched layer on an upper surface of a silicon oxide interlayer insulation film covering an underlying metallization by ion implantation of hydrogen into the film;

forming on said hydrogen-enriched layer and said silicon oxide interlayer insulation film a resist pattern having an inversely tapered cross-sectional shape; and etching said hydrogen-enriched layer and said silicon oxide interlayer insulation film using said resist pattern as a mask and an etching gas containing a fluorocarbon based compound;

wherein hydrogen released from said hydrogen-enriched layer during said etching is utilized for promoting deposition of an etching reaction product, and said silicon oxide interlayer insulation film is etched while the cross-sectional shape of said resist pattern is shaped in a substantially vertical wall state by the deposition.

11. The method of producing a semiconductor device as claimed in claim 10 wherein said resist pattern is formed by using a chemical amplification negative photoresist material.

12. The method of producing a semiconductor device as claimed in claim 10 wherein said underlying metallization is constituted by using one material selected from the group consisting of an impurity diffused region in a single crystal silicon substrate, a polysilicon layer, a polycide film, an aluminum based material layer, a silicide layer and a refractory metal layer.

13. The method of producing a semiconductor device as claimed in claim 10 wherein said etching gas contains a hydrofluorocarbon based compound.

* * * * *